US007875420B2

(12) United States Patent
Inatomi

(10) Patent No.: US 7,875,420 B2
(45) Date of Patent: Jan. 25, 2011

(54) METHOD FOR IMPROVING SURFACE ROUGHNESS OF PROCESSED FILM OF SUBSTRATE AND APPARATUS FOR PROCESSING SUBSTRATE

(75) Inventor: Yuichiro Inatomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1275 days.

(21) Appl. No.: 10/559,332

(22) PCT Filed: May 31, 2004

(86) PCT No.: PCT/JP2004/007486

§ 371 (c)(1), (2), (4) Date: May 30, 2006

(87) PCT Pub. No.: WO2004/109779

PCT Pub. Date: Dec. 16, 2004

(65) Prior Publication Data

US 2006/0237127 A1 Oct. 26, 2006

(30) Foreign Application Priority Data

Jun. 6, 2003 (JP) ............................ 2003-162054

(51) Int. Cl.
*G03F 7/40* (2006.01)

(52) U.S. Cl. .................... 430/331; 430/270.1; 430/311; 430/330

(58) Field of Classification Search ............. 430/270.1, 430/311, 331, 330
See application file for complete search history.

(56) References Cited

U.S. PATENT DOCUMENTS

| | | | | |
|---|---|---|---|---|
| 6,416,579 | B1 | 7/2002 | Thallner | |
| 7,466,025 | B2 * | 12/2008 | Goodner et al. | 257/750 |
| 2001/0033895 | A1 | 10/2001 | Minami et al. | |
| 2001/0053570 | A1 | 12/2001 | Kido | |
| 2003/0049571 | A1 | 3/2003 | Hallock et al. | |
| 2003/0084925 | A1 | 5/2003 | Nakajima et al. | |
| 2004/0198066 | A1 * | 10/2004 | Verhaverbeke | 438/745 |
| 2005/0084807 | A1 * | 4/2005 | Meagley et al. | 430/464 |
| 2005/0139238 | A1 * | 6/2005 | Ferrara | 134/22.11 |

FOREIGN PATENT DOCUMENTS

| | | |
|---|---|---|
| JP | 62 219923 | 9/1987 |
| JP | 62 295418 | 12/1987 |
| JP | 63 148631 | 6/1988 |
| JP | 64 069014 | 3/1989 |
| JP | 07 005695 | 1/1995 |

(Continued)

*Primary Examiner*—Amanda C. Walke
(74) *Attorney, Agent, or Firm*—Oblon, Spivak, McClelland, Maier & Neustadt, L.L.P.

(57) ABSTRACT

To improve the surface roughness of a resist film formed on a wafer.

In a coating and developing treatment system, a wafer W on which a resist film has been formed and subjected to exposure and developing treatment is adjusted to a predetermined temperature. A solvent gas is supplied to the surface of the temperature-adjusted wafer W to dissolve the surface of the resist film. The wafer W is then heated to volatilize the solvent in the resist film to thereby heat shrink the resist film. This levels the projections and depressions on the surface of the resist film so as to improve the surface roughness of the resist film.

9 Claims, 16 Drawing Sheets

1
2 3 G3 13 G5 G4 5 4
C W W W W 51 50 X θ X θ 7 6 8 18 G1 20 G2

FOREIGN PATENT DOCUMENTS

| | | | |
|---|---|---|---|
| JP | 10-50595 | | 2/1998 |
| JP | 2001 127037 | | 5/2001 |
| JP | 2002 075854 | | 3/2002 |
| JP | 2002 0055429 | | 7/2002 |
| JP | 2002 217160 | | 8/2002 |
| WO | 98 37575 | | 8/1998 |
| WO | WO 2005/104194 | A1 | 11/2005 |

* cited by examiner 1
2
3
4
5
6
7
8
13
18
20
50
51
$G_1$
$G_2$
$G_3$
$G_4$
$G_5$
C
W
X
θ

19
19a
60a
W
60
61
62
63
64
70
71
72
73
74
75
83
87
88
90
91
92
93
94
Y 19
19a
83
88
92
94
93
91
87
90
ヒータ:110
W
60a
74
74
70
71
73
75
72
111
61
60
75
112
Y 19
19a
88
92
94
93
91
87
90
83
W
60a
60
61
62
126
63
64
75
75
120
123

METHOD FOR IMPROVING SURFACE ROUGHNESS OF PROCESSED FILM OF SUBSTRATE AND APPARATUS FOR PROCESSING SUBSTRATE

TECHNICAL FIELD

The present invention relates to a method of improving surface roughness of a treatment film on a substrate and a substrate treatment apparatus.

BACKGROUND ART

In a photolithography process in a manufacturing process of a semiconductor device, for example, resist coating treatment in which a resist solution is applied onto a base film of a semiconductor wafer (hereinafter, referred to as a "wafer") to form a resist film; exposure processing in which a predetermined pattern is exposed on the wafer; developing treatment in which the wafer after exposure is developed; etching treatment in which the base film or the like on the wafer is etched, and so on are performed, so that a predetermined circuit pattern is formed on the wafer.

In the aforementioned exposure processing, light is applied to a predetermined portion of the flat resist film to change the solubility of the exposed portion to a developing solution. In the developing treatment, when the developing solution is supplied to the wafer, the resist film at the exposed portion is selectively dissolved and removed, if it is, for example, a positive-type resist, resulting in a desired pattern of the resist film formed on the wafer. In the etching treatment, the base film being a lower layer is selectively etched with the resist film in the aforementioned predetermined pattern functioning as a mask (see, for example, Patent Document 1).

[Patent Document 1]

Japanese patent Application Laid-open No. 2002-75854

Incidentally, on the surface of the resist film which has been subjected to the aforementioned developing treatment, for example, a plurality of horizontal lines appear on the side wall surface as shown in FIG. 17, resulting in projections and depressions on the surface of the resist film R. This is conceivably caused by the wave property of light applied from above the wafer during exposure processing.

DISCLOSURE OF THE INVENTION

Problems to Be Solved by the Invention

The formation of projections and depressions on the surface of the resist film roughens the surface, thereby causing, for example, projections and depressions such as vertical lines corresponding to the aforementioned horizontal lines on the resist film to appear on the base film when the base film is subjected to etching treatment using the resist film as a mask. As a result of the appearance of projections and depressions on the surface of the base film due to the formation of the vertical lines in the base film, a precise circuit pattern is no longer formed on the wafer, thus resulting in a failure to manufacture a semiconductor device with a desired quality. Particularly, in these days when the circuit pattern has been made finer, even slight projections and depressions greatly affect the shape of the circuit pattern, and therefore it is an important problem to improve the surface roughness of the resist film.

The present invention has been developed in consideration of the above point and its object is to provide a method of improving surface roughness of a treatment film such as a resist film formed on a substrate such as a wafer and a substrate treatment apparatus.

Means for Solving the Problems

To achieve the above object, the present invention is a method of improving surface roughness of a treatment film formed on a substrate, including the step of: after exposing and developing the substrate, supplying a solvent gas of the treatment film to a surface of the treatment film to dissolve only the surface of the treatment film on the substrate. Note that the "dissolution" in this case means the state in which, for example, the solvent gas is absorbed, for example, in the treatment film and the treatment film dissolves and swells.

According to the present invention, the solvent gas is supplied to the surface of the treatment film on the substrate to dissolve only the surface of the treatment film, so that the projections and depressions on the surface of the treatment film are leveled and thereby smoothed. Thereafter, by heating the substrate, for example, the treatment film which has absorbed the solvent gas and thereby swelled is dried to be heat-shrunk. As a result, the surface of the treatment film is flattened, whereby the surface roughness of the treatment film can be improved.

The method of improving surface roughness of a treatment film formed on a substrate may further include the step of, before the step of supplying the solvent gas to the surface of the treatment film, temperature-adjusting the substrate to a predetermined temperature. The degree of dissolution of the surface of the treatment film by the supply of the solvent gas depends on the temperature. Therefore, the temperature of the substrate is adjusted to a predetermined temperature before the supply of the solvent gas, thereby allowing only the surface of the treatment film to appropriately dissolve. Besides, since the temperature within the substrate may become slightly uneven in the developing treatment being the previous treatment, the temperature of the substrate can be adjusted to improve the uniformity in temperature within the substrate, thereby dissolving evenly the surface of the treatment film within the substrate.

Further, in the present invention, after exposing and developing the substrate, it is preferable that the solvent gas of the treatment film is supplied to a region of a part of the surface of the substrate and the region to be supplied with the solvent gas is moved, so that the solvent gas is supplied to the entire surface of the treatment film.

According to the present invention, the solvent gas is being supplied to a region of a part of the surface of the substrate, while the supply region is being moved, so that the solvent gas in an appropriate amount to dissolve only the surface of the treatment film can be supplied to the treatment film on the surface of the substrate.

It should be noted that when supplying the solvent gas of the treatment film to the surface of the treatment film, the solvent gas of the treatment film may be supplied from above the substrate toward the entire surface of the substrate.

Furthermore, in the present invention, after exposing and developing the substrate and before supplying the solvent gas of the treatment film to the surface of the treatment film, a treatment step may be performed to decompose a protecting group inhibiting dissolution in the treatment film. This allows the above-described smoothing effect to be implemented even for a so-called ArF resist. The protecting groups to inhibit dissolution in the treatment film include, for example, a lactone group.

Examples of such a treatment to decompose the protecting group inhibiting dissolution in the treatment film include irradiation of ultraviolet or electron beam.

The present invention is particularly useful in smoothing the resist film in the photolithography process. The usable solvent gas in that case is a vapor of each of acetone, propylene glycol monomethyl ether acetate (PGMEA), and N-methyl-2-pyrrolidinone (NMP). For more preferable usage, PGMEA is suitable for a resist film for KrF (having a wavelength of 248 nm), and NMP is suitable for a resist film for ArF (having a wavelength of 193 nm).

A substrate treatment apparatus of the present invention is a treatment apparatus for treating a substrate on a surface of which a treatment film has been formed and subjected to exposure processing and developing treatment including a nozzle for supplying a solvent gas of the treatment film to the surface of the treatment film on the substrate.

According to the present invention, after the treatment film is formed on the substrate and the substrate is subjected to exposure and development, the solvent gas can be supplied to the surface of the treatment film on the substrate to dissolve only the surface of the treatment film. This levels and smoothes the projections and depressions formed on the surface of the treatment film, thereby improving the surface roughness of the treatment film.

The substrate treatment apparatus may include a moving mechanism for moving the nozzle which is being the solvent gas, relative to the substrate. In this case, the nozzle is moved above the surface of the substrate, for example, with the nozzle discharging the solvent gas, whereby the solvent gas in an appropriate amount can be supplied to the entire surface of the treatment film. Accordingly, the solvent gas can be supplied to the treatment film so as to dissolve only the surface of the treatment film.

The nozzle may have an elongated discharge portion at least longer than a diameter of the substrate. In this case, the nozzle is moved above the substrate from the one end side to the other end side of the substrate, whereby the solvent gas can be supplied onto the entire surface of the treatment film formed on the substrate.

The substrate treatment apparatus may include a temperature-adjusting mechanism for adjusting a temperature of the substrate. This temperature-adjusting mechanism can adjust the temperature of the substrate, for example, before the solvent gas is supplied to the substrate. Since the dissolution of the treatment film by the solvent gas is affected by the temperature, previous setting of the substrate to a predetermined temperature allows only the surface of the treatment film to appropriately dissolve. Besides, since the temperature within the substrate can be made uniform, the dissolution within the treatment film can be uniformly performed over the entire surface of the substrate.

The substrate treatment apparatus may include a heating mechanism for heating the substrate. In this case, after the solvent gas is supplied to the surface of the treatment film on the substrate, the substrate can be heat-dried and thereby heat-shrunk. It should be noted that the substrate treatment apparatus may include a developing treatment mechanism for performing developing treatment for the substrate. In this case, the substrate can be developed, and thereafter the solvent can be supplied in the same unit.

The nozzle may have partition plates at a front and a rear of the discharge portion, that is, at the front and the rear in the moving direction of the nozzle. This can prevent the solvent gas discharged from the discharge portion from diffusing to the surroundings, resulting in uniform supply of the solvent gas as a whole.

Effect of the Invention

According to the present invention, the surface roughness of the treatment film on the substrate can be improved so that, for example, a circuit pattern having a predetermined dimension is formed on a substrate, and, for example, subsequent etching treatment or the like is preferably performed, resulting in improved yields.

A plan view showing the outline of a configuration of a coating and developing treatment system in the present embodiment.

[FIG. 2]

Figure 1:
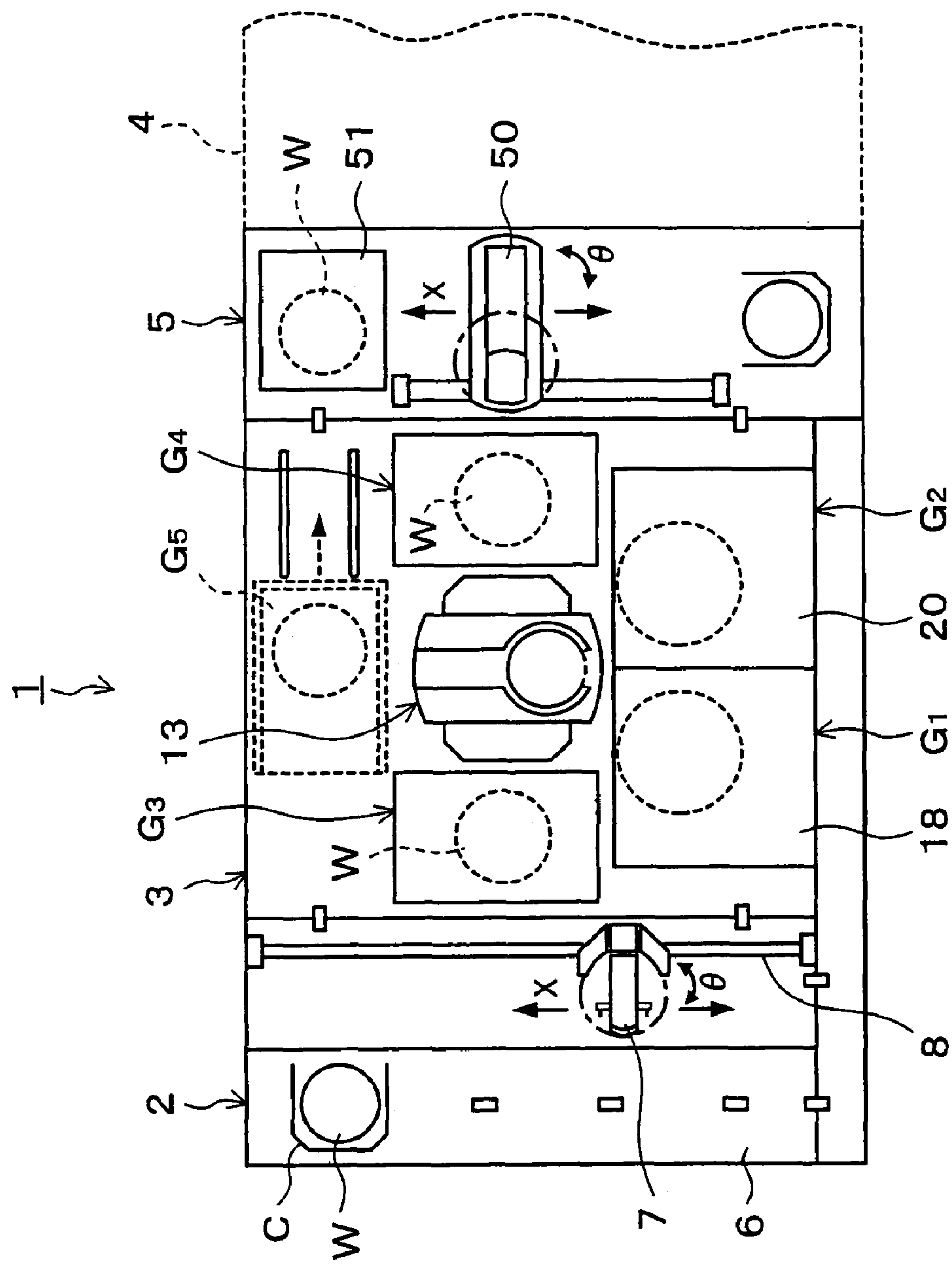
[FIG. 1]

A front view of the coating and developing treatment system in FIG. 1.

[FIG. 3]

A rear view of the coating and developing treatment system in FIG. 1.

[FIG. 4]

An explanatory view of a longitudinal section of a solvent supply unit.

[FIG. 5]

An explanatory view of a transverse section of the solvent supply unit.

[FIG. 6]

A perspective view showing the configuration of a solvent supply nozzle.

[FIG. 7]

An explanatory view of a longitudinal section showing the configuration of a heating unit.

[FIG. 8]

A flowchart showing a part of a processing process of a wafer.

[FIG. 9]

An explanatory view showing the appearance of change of a resist film.

[FIG. 10]

An explanatory view of a longitudinal section showing the configuration of a solvent supply unit with a heating mechanism.

[FIG. 11]

An explanatory view of a transverse section showing the configuration of the solvent supply unit with a developing treatment mechanism.

[FIG. 12]

Figure 11:
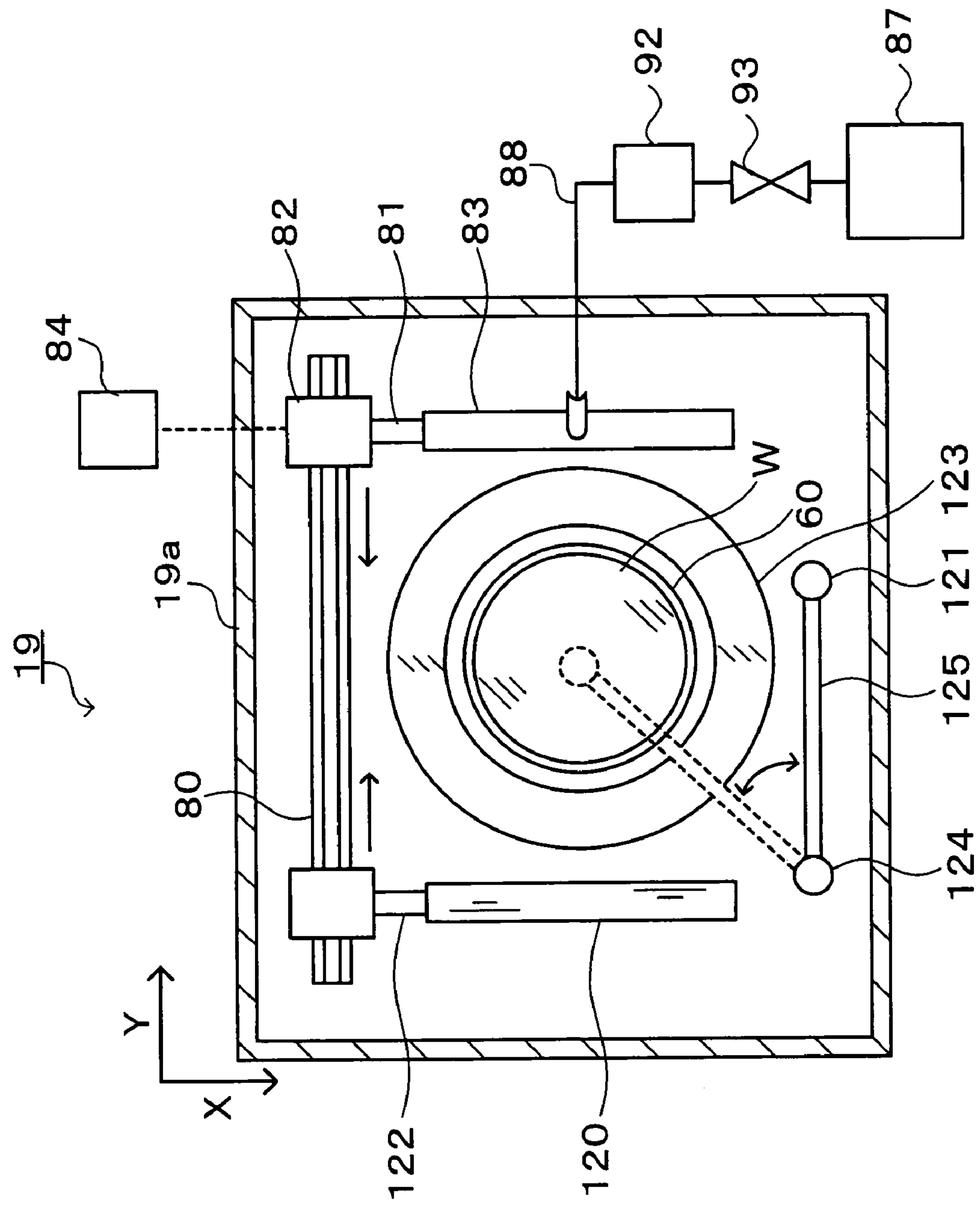

An explanatory view of a longitudinal section showing the configuration of the solvent supply unit in FIG. 11.

[FIG. 13]

A graph showing changes in line width and LWR when a smoothing treatment is performed by supply of solvent gas and a partially enlarged plan view of a resist pattern.

[FIG. 14]

A side view of the solvent supply nozzle showing the appearance where partition plates are attached to the front and the rear of a discharge portion of the solvent supply nozzle.

[FIG. 15]

An explanatory view of a longitudinal section of a treatment container in which the solvent gas is supplied to the entire surface of the wafer at a time.

[FIG. 16]

An explanatory view of a longitudinal section of a treatment unit having an irradiation unit for ultraviolet or electron beam.

[FIG. 17]

An explanatory view showing projections and depressions on the surface of a resist film after the developing treatment.

EXPLANATION OF CODES

1 coating and developing treatment system
19 solvent supply unit
60 chuck
70 exhaust cup
83 solvent supply nozzle
W wafer

BEST MODE FOR CARRYING OUT THE INVENTION

Figure 2:
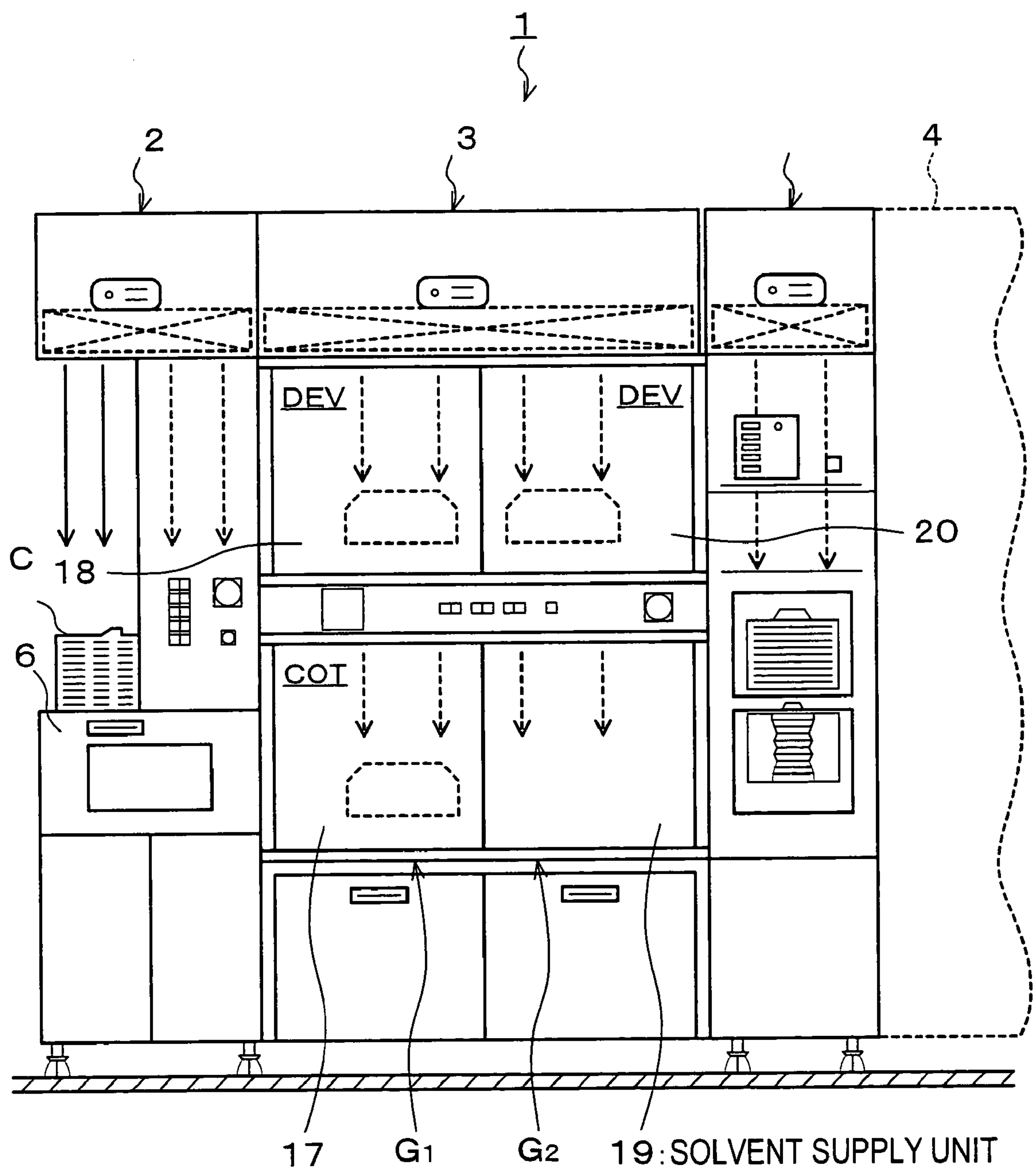
Figure 3:
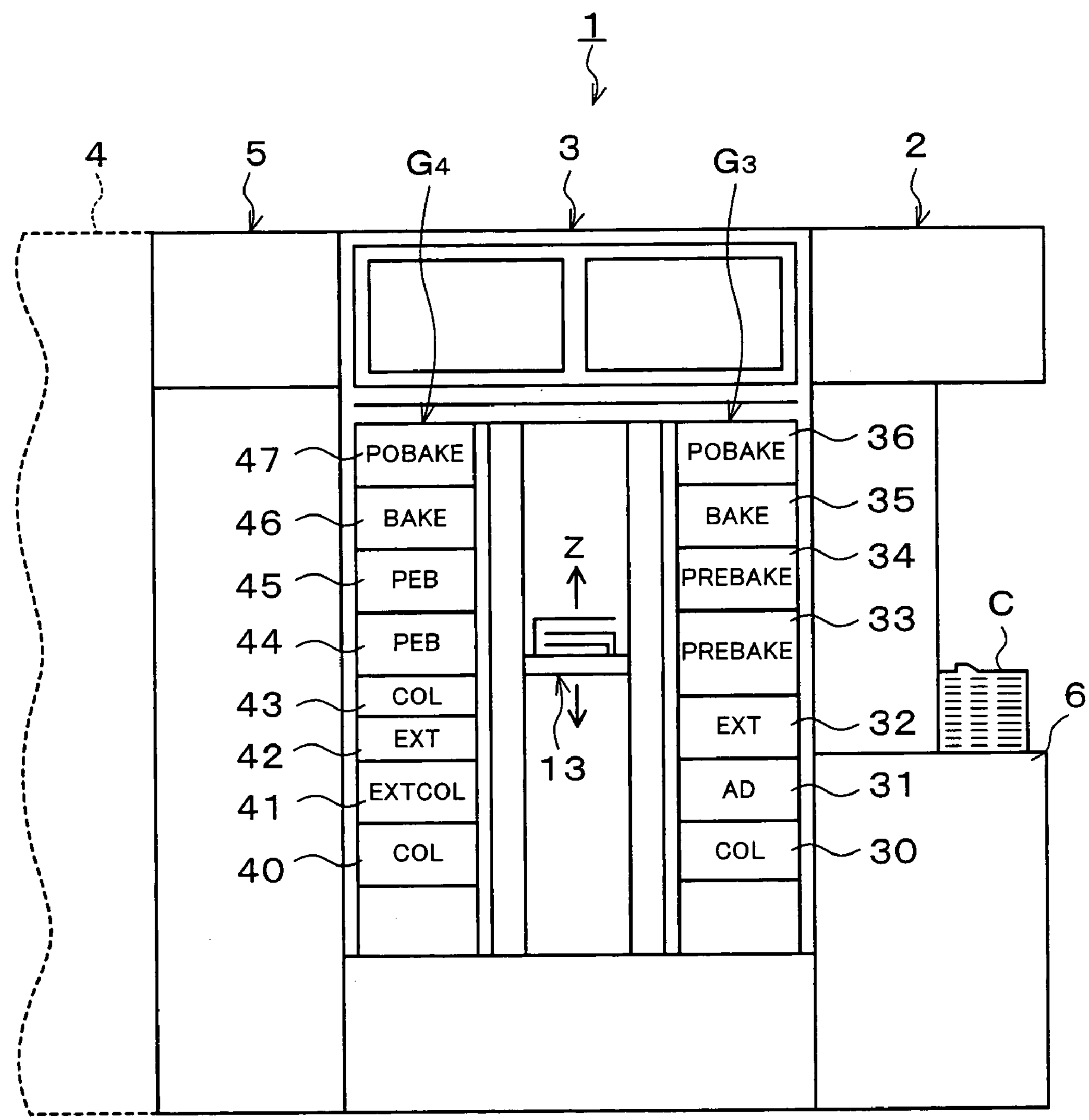

Hereinafter, a preferred embodiment of the present invention will be described. FIG. 1 is a plan view showing the outline of a configuration of a coating and developing treatment system 1 incorporating a substrate treatment apparatus according to the present embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers per cassette as a unit from/to the outside into/from the coating and developing treatment system 1 and carrying the wafers W into/out of the cassette C; a processing station 3 including various kinds of processing and treatment units, which are multi-tiered, for performing predetermined processing or treatments in a manner of single wafer processing in coating and developing treatment processes; and an interface section 5 for transferring the wafers W to/from an aligner 4 provided adjacent to the processing station 3, are integrally connected together.

In the cassette station 2, a plurality of cassettes C can be freely mounted at predetermined positions on a cassette mounting table 6 being a mounting section in a line in an X-direction (a top-to-bottom direction in FIG. 1). A wafer carrier 7, which is movable in a cassette-arrangement direction (the X-direction) and in a wafer-arrangement direction of the wafers W housed in the cassette C (a Z-direction; the vertical direction), is further provided along a carrier path 8 and thus can selectively access each of the cassettes C.

The wafer carrier 7 includes an alignment function of aligning the wafer W. The wafer carrier 7 is configured, as described later, to be able to also access an extension unit 32 included in a third processing unit group G3 on the processing station 3 side.

In the processing station 3, a main carrier unit 13 is provided at its central portion, and various kinds of processing and treatment units are multi-tiered to constitute processing unit groups around the main carrier unit 13. In this coating and developing treatment system 1, four processing unit groups G1, G2, G3, and G4 are arranged. The first and second processing unit groups G1 and G2 are placed on the front side of the coating and developing treatment system 1, the third processing unit group G3 is placed adjacent to the cassette station 2, and the fourth processing unit group G4 is placed adjacent to the interface section 5. Further, as an option, a fifth processing unit group G5 shown by a broken line can be separately placed on the rear side. The main carrier unit 13 can carry the wafer W to the later-described various kinds of processing and treatment units located in these processing unit groups G1, G2, G3, G4, and G5. Note that the number and arrangement of the processing unit groups can be arbitrarily selected depending on the kind of processing to be performed on the wafer W.

In the first processing unit group G1, as shown in FIG. 2, for example, a resist coating unit 17 for applying a resist solution to the wafer W to form a resist film on the wafer W and a developing treatment unit 18 for developing the wafer W are two-tiered in order from the bottom. In the second processing unit group G2, a solvent supply unit 19 as a substrate treatment apparatus according to the present embodiment and a developing treatment unit 20 are two-tiered in order from the bottom.

In the third processing unit group G3, as shown in FIG. 3, for example, a cooling unit 30 for cooling the wafer W, an adhesion unit 31 for enhancing adhesion between the resist solution and the wafer W, the extension unit 32 for transferring the wafer W, pre-baking units 33 and 34 each for evaporating the solvent in the resist solution, a heating unit 35 for heat-drying the wafer W supplied with the solvent gas, and a post-baking unit 36 for performing heating processing after the developing treatment are, for example, seven-tiered in order from the bottom.

In the fourth processing unit group G4, for example, a cooling unit 40, an extension and cooling unit 41 for allowing the wafer W mounted thereon to naturally cool, an extension unit 42, a cooling-unit 43, post-exposure baking units 44 and 45 each for performing heating processing after exposure, a heating unit 46, and a post-baking unit 47 are, for example, eight-tiered in order from the bottom.

At the center portion of the interface section 5, for example, a wafer carrier 50 is provided as shown in FIG. 1. The wafer carrier 50 is configured to be freely movable in the X-direction (the top-to-bottom direction in FIG. 1) and the Z-direction (the vertical direction) and also freely rotatable in a θ-direction (a direction of rotation around the X-axis). The wafer carrier 50 can access the extension and cooling unit 41, the extension unit 42, and an edge exposure unit 51 included in the fourth processing unit group G4 and the aligner 4 and carry the wafer W to each of them.

Figure 4:
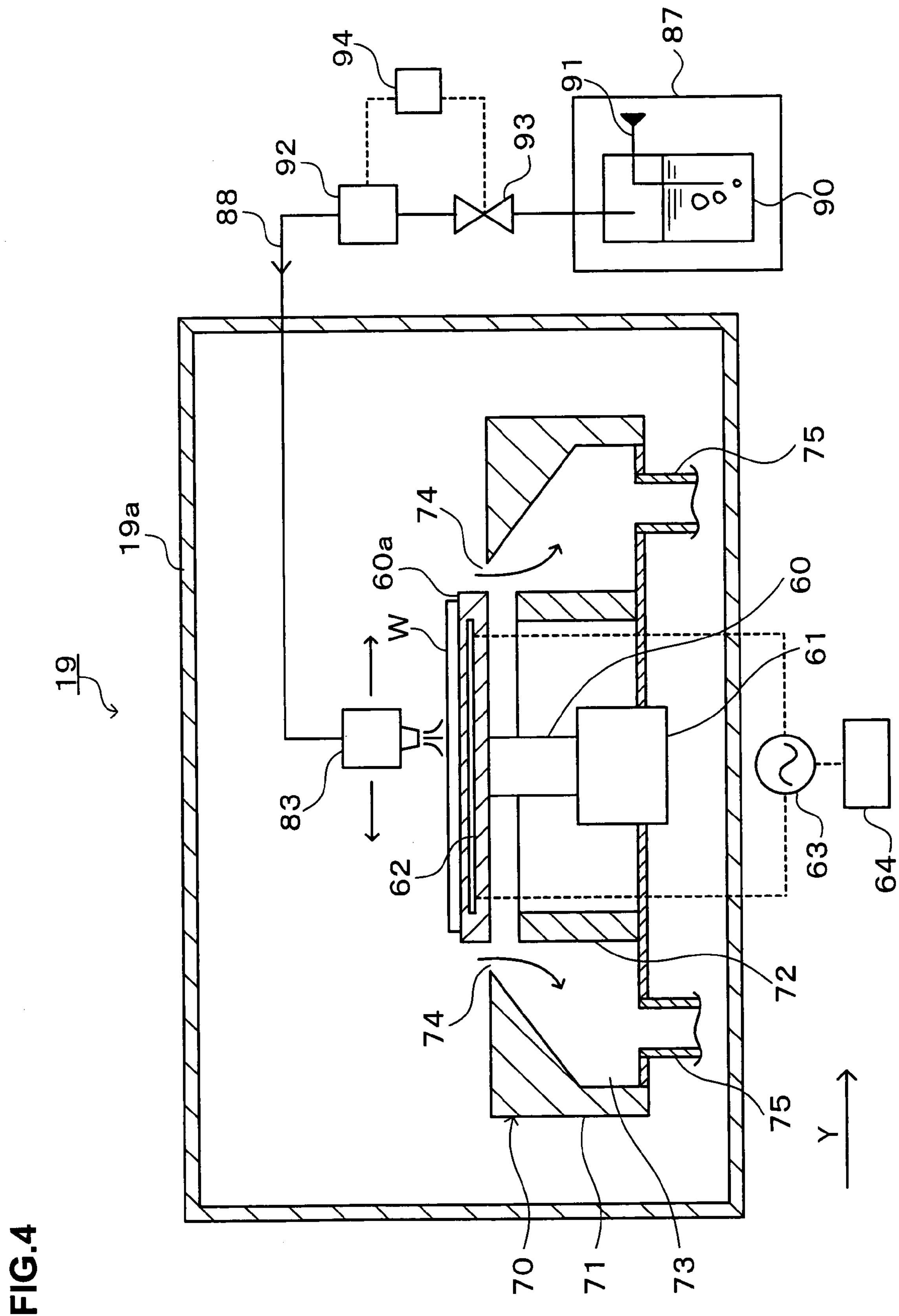
Figure 5:
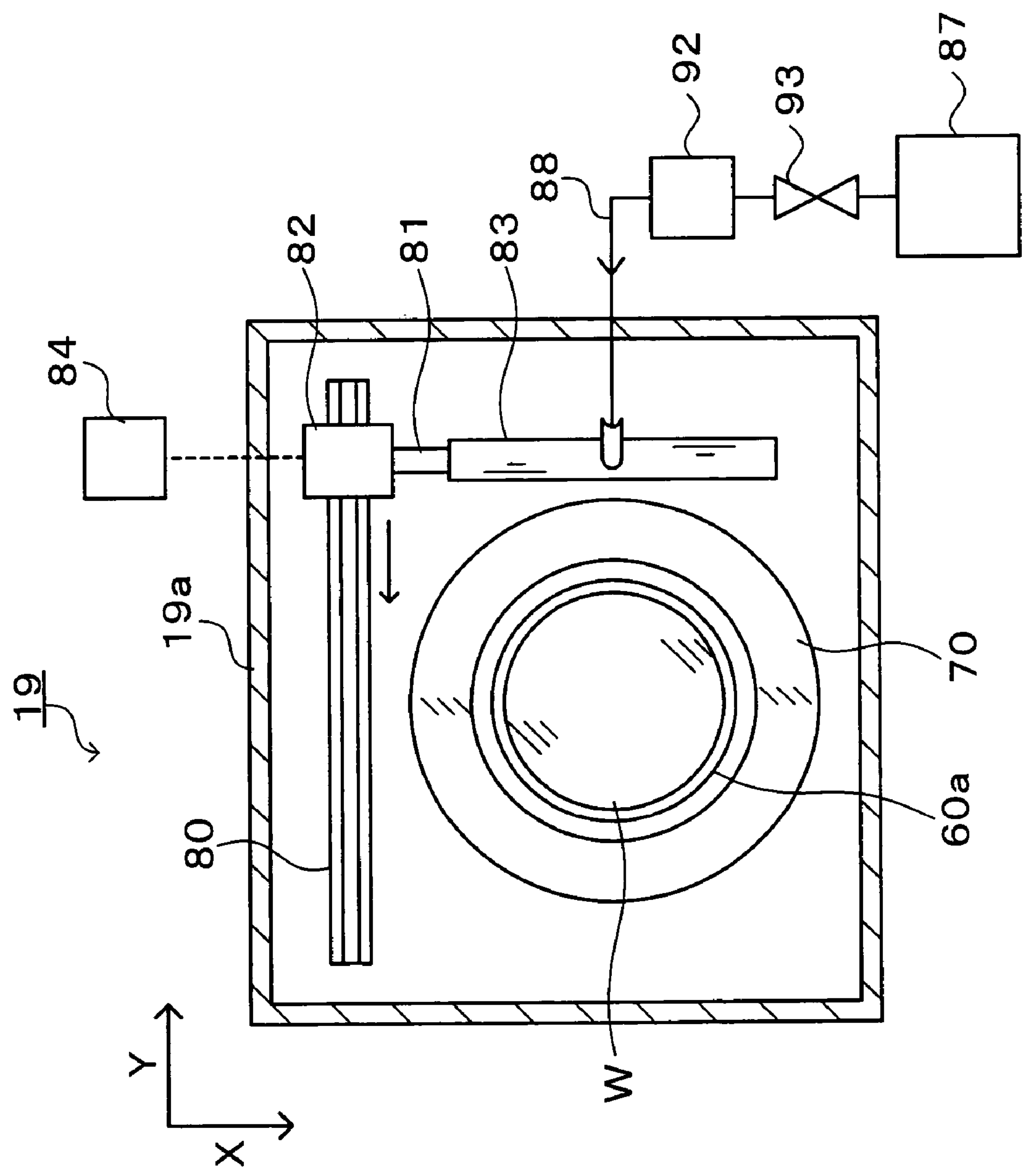

Next, the configuration of the aforementioned solvent supply unit 19 will be described in detail. As shown in FIGS. 4 and 5, at the center portion in a casing 19*a* of the solvent supply unit 19, a chuck 60 for holding the wafer W thereon is provided. A holding surface 60*a* being the upper surface of the chuck 60 is formed in a circle having almost the same diameter as that of the wafer W. The holding surface 60*a* of the chuck 60 is provided with a plurality of suction holes, not shown, so that suction through the suction holes can suck the wafer W onto the holding surface 60*a*. The chuck 60 is provided with a raising and lowering drive unit 61 such as a cylinder which can move the holding surface 60*a* of the chuck 60 up and down to transfer the wafer W to/from the main carrier unit 13.

Peltier elements 62 are built in the holding surface 60*a* of the chuck 60. The Peltier elements 62 are evenly arranged within the holding surface 60*a*. A power supply 63 to the Peltier elements 62 is controlled by a temperature controller 64. The temperature controller 64 varies the amount of power supply to the Peltier elements 62 to adjust the temperature of the Peltier elements 62 so that the temperature of the holding surface 60*a* of the chuck 60 can be set to a predetermined temperature. It should be noted that the Peltier elements 62, the power supply 63, and the temperature controller 64 constitute a temperature-adjusting mechanism.

Around the chuck 60, for example, an exhaust cup 70 for exhausting gas is provided. The exhaust cup 70 is located, for example, below the holding surface 60*a* of the chuck 60. The exhaust cup 70 has a double structure composed of, for example, an outer cup 71 and an inner cup 72 which are cylindrical, and an exhaust path 73 is formed between the outer cup 71 and the inner cup 72. In the clearance between top ends of the outer cup 71 and the inner cup 72, an annular suction port 74 is opened and disposed along the peripheral portion of the holding surface 60*a* as shown in FIG. 5. To the clearance between bottom ends of the outer cup 71 and the inner cup 72, an exhaust pipe 75 is connected which leads to an exhauster (not shown) located outside the solvent supply unit 19 and can exhaust the atmosphere above the chuck 60 through the suction port 74 as necessary.

As shown in FIG. 5, on the side of the exhaust cup 70 on the negative direction side in an X-direction (an upper direction in FIG. 5), a rail 80 is provided along a Y-direction (a right-to-left direction in FIG. 5). The rail 80 is provided, for example, from the outside on one end side to the outside on the other end side of the exhaust cup 70. On the rail 80, an arm 81 is provided which is freely movable on the rail 80 by means of a drive unit 82. On the arm 81, a solvent supply nozzle 83 as a nozzle for discharging a solvent gas onto the wafer W is held. Accordingly, the solvent supply nozzle 83 can move along the rail 80 from the outside on the one end side of the exhaust cup 70, passing over the chuck 60, to the outside on the other end side of the exhaust cup 70. The movement of the solvent supply nozzle 83 is controlled, for example, by a drive controller 84 for controlling the motion of the drive unit 82. The drive controller 84 can move the solvent supply nozzle 83 in the Y-direction at a predetermined speed. The drive unit 82 includes, for example, a cylinder for moving the arm 81 up and down and can adjust the height of the solvent supply nozzle 83. It should be noted that the rail 80, the arm 81, the drive unit 82, and the drive controller 84 constitute a moving mechanism in this embodiment.

Figure 6:
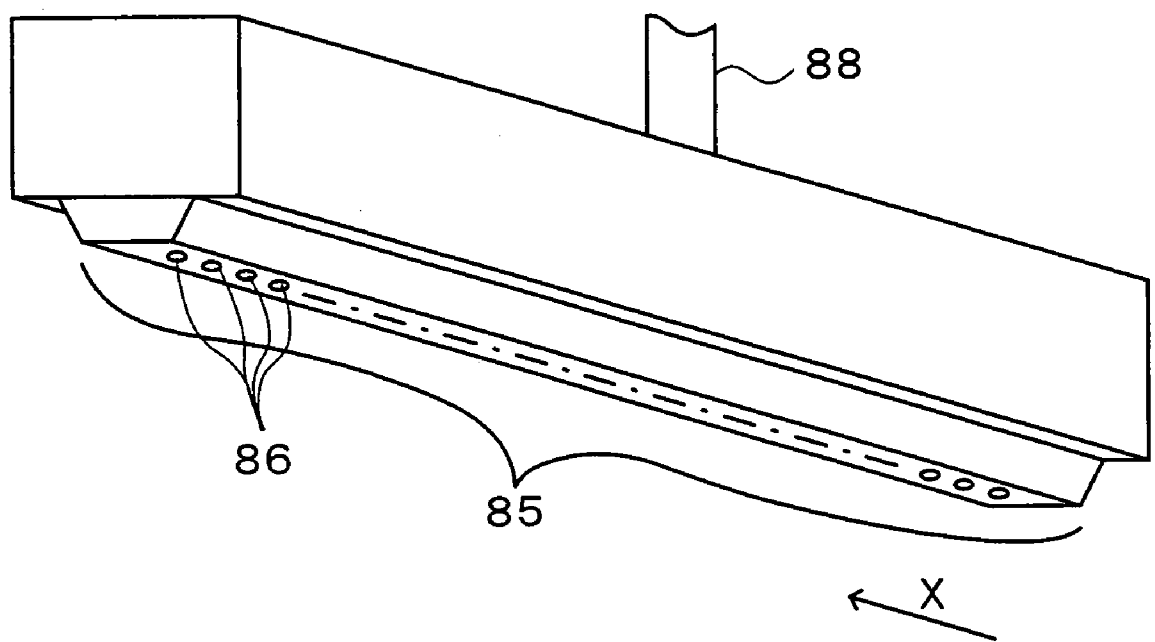

This solvent supply nozzle 83 has an elongated shape along the X-direction having, for example, a length longer than the diameter of the wafer W. The lower surface of the solvent supply nozzle 83 is formed with a discharge portion 85 from one end portion to the other end portion in its longitudinal direction as shown in FIG. 6. The discharge portion 85 is formed with a plurality of circular discharge ports 86 along the longitudinal direction of the solvent supply nozzle 83. As shown in FIG. 4, for example, to the upper portion of the solvent supply nozzle 83, a solvent supply pipe 88 is connected which communicates with a solvent gas supply source 87. The solvent supply nozzle 83 can introduce a solvent gas from the upper portion, pass the solvent gas through the inside, and uniformly discharge the solvent gas downward from the discharge ports 86 in the lower surface.

The solvent gas supply source 87 includes, for example, a storage tank 90 communicating with the solvent supply pipe 88 and storing a liquid solvent, and a nitrogen gas supply pipe 91 for supplying an inert nitrogen gas into the storage tank 90. Supply of the nitrogen gas through the nitrogen gas supply pipe 91 into the liquid solvent in the storage tank 90 sends with pressure the solvent gas evaporating inside the storage tank 90 into the solvent supply pipe 88, whereby the solvent gas passes through the solvent supply pipe 88 to be supplied to the solvent supply nozzle 83. The usable solvents include, for example, acetone, propylene glycol monomethyl ether acetate (PGMEA), and N-methyl-2-pyrrolidinone (NMP).

The solvent supply pipe 88 is provided with a flow rate sensor 92 for detecting the flow rate of the solvent gas and a valve 93 for adjusting the flow rate. The detection result detected by the flow rate sensor 92 is outputted to a flow rate controller 94, so that the flow rate controller 94 can adjust the opening/closing degree of the valve 93 based on the detection result to set the flow rate of the solvent gas discharged from the solvent supply nozzle 83 to a predetermined flow rate.

Figure 7:
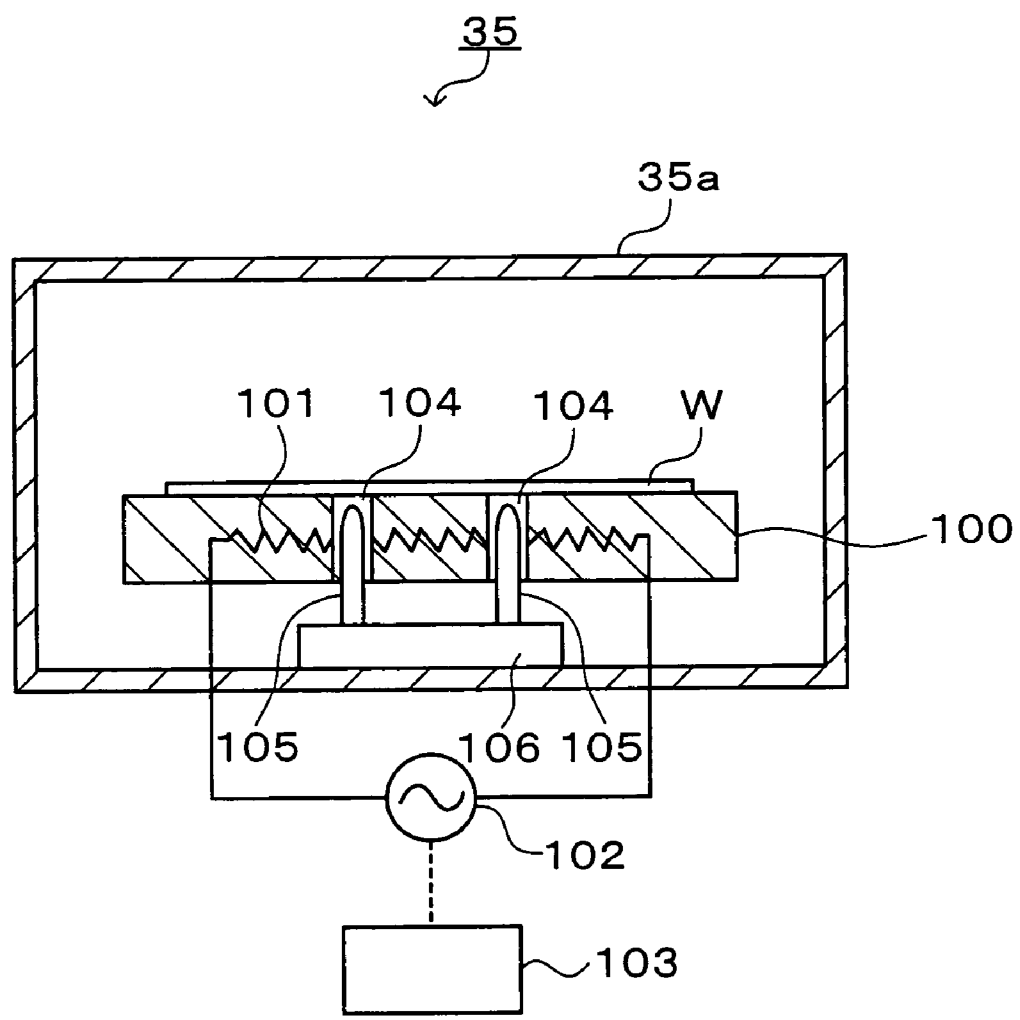

The solvent supply unit 19 is configured as described above. Next, the configuration of the aforementioned heating units 35 and 46 will be described. For example, the heating unit 35 has, in a casing 35*a*, a heating plate 100 for heating the wafer W mounted thereon as shown in FIG. 7. The heating plate 100 incorporates a heater 101 which generates heat by supply of power. A power supply 102 to the heater 101 is controlled by a heater controller 103 so that the heater controller 103 can adjust the amount of heat generation by the heater 101 to control the temperature of the heating plate 100.

At the center portion of the heating plate 100, through holes 104 are formed which vertically penetrate the heating plate 100. In the through holes 104, raising and lowering pins 105 are inserted from below. The raising and lowering pins 105 are raised and lowered by means of a raising and lowering unit 106 to freely protrude from the surface of the heating plate 100. Accordingly, the raising and lowering pins 105 can raise the wafer W to transfer the wafer W, for example, between the main carrier unit 13 and the heating plate 100. Note that the heating unit 46 has the same configuration as that of the heating unit 35, and therefore the description thereof will be omitted.

Next, the processing process in the coating and developing treatment apparatus 1 including the solvent supply unit 19 and the heating unit 35 configured as described above will be described.

First, one unprocessed wafer W is taken out of the cassette C by the wafer carrier 7 and carried to the extension unit 32 included in the third processing unit group G3. The wafer is then carried by the main carrier unit 13 into the adhesion unit 31 where, for example, HMDS for enhancing adhesion of the resist solution is applied to the wafer W. The wafer W is then carried to the cooling unit 30 to be cooled to a predetermined temperature, and thereafter carried to the resist coating unit 17. In the resist coating unit 17, the resist solution is applied onto the wafer W to form a resist film as a treatment film.

Figure 8:
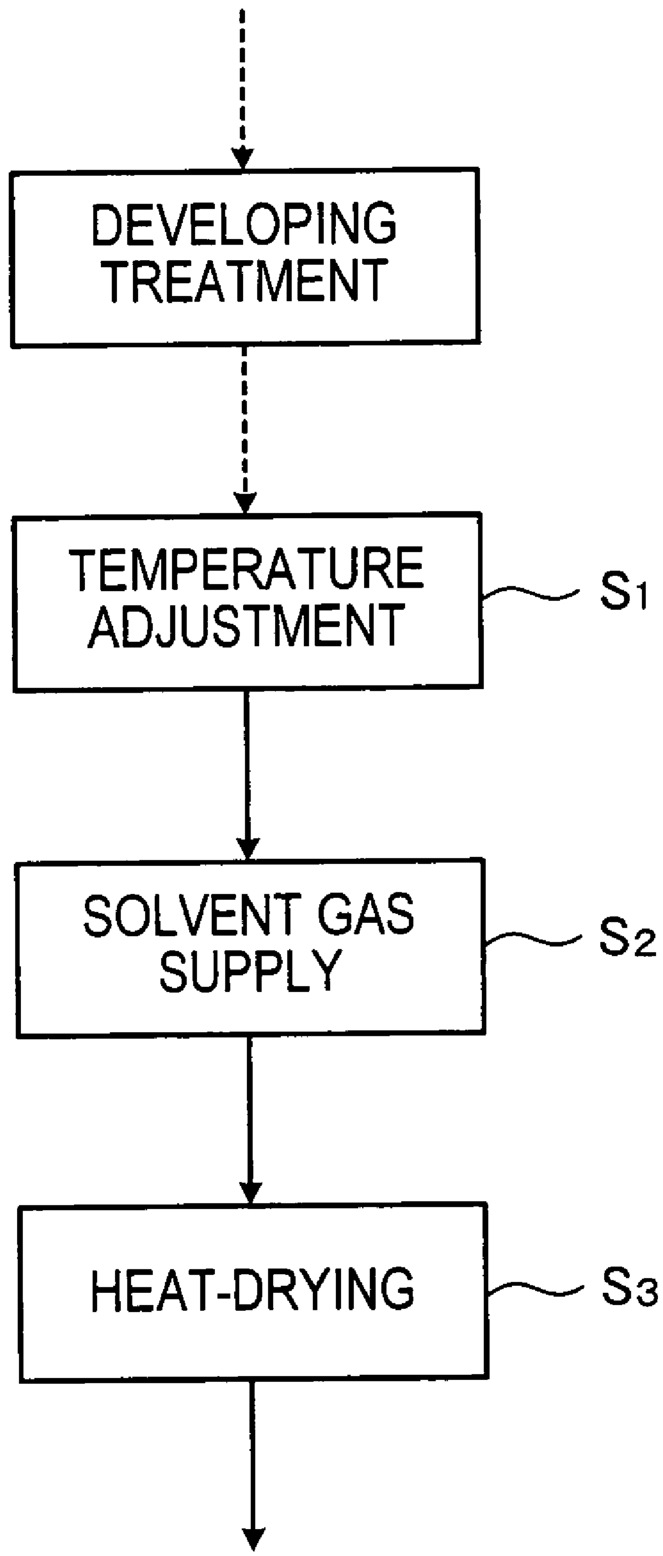
Figure 13:
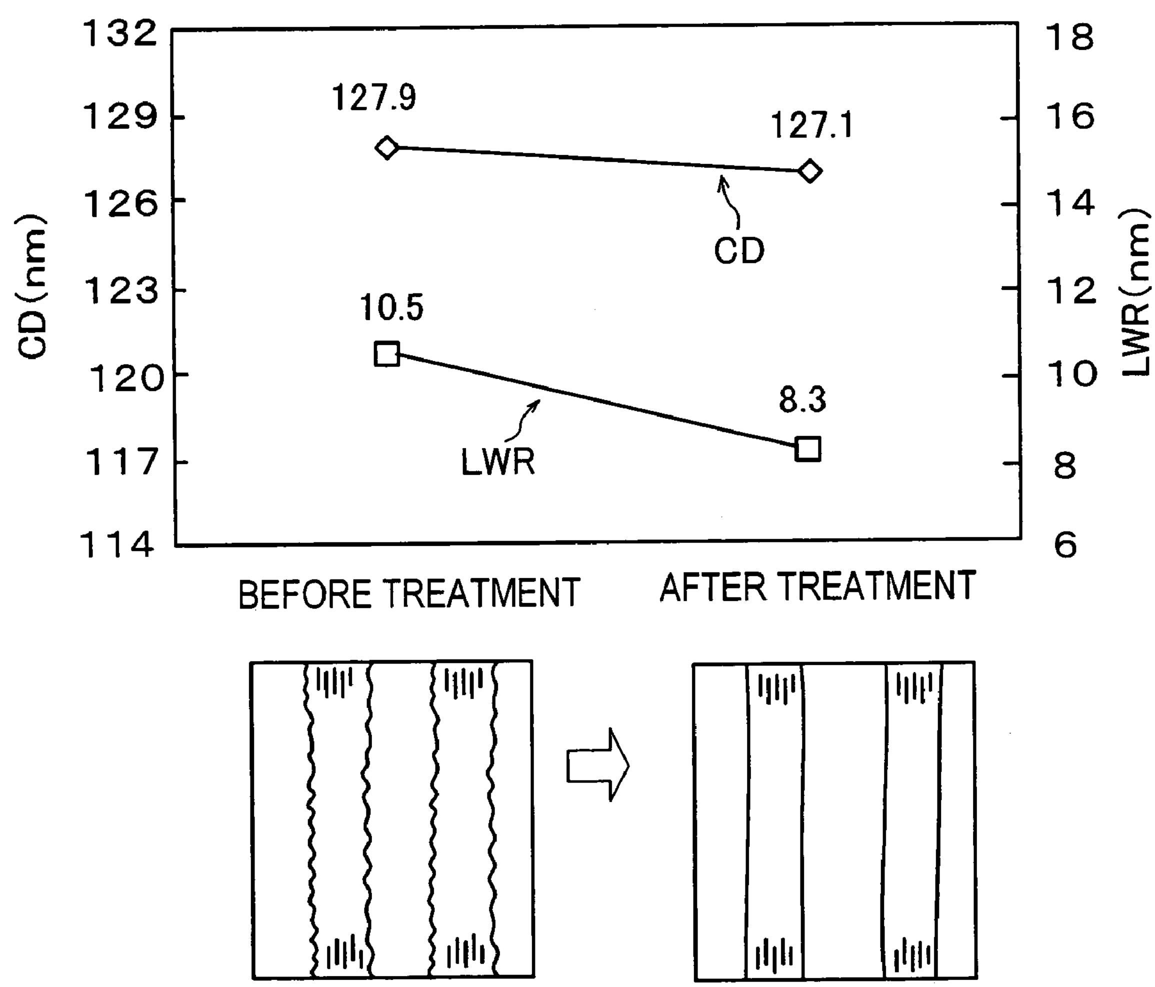
Figure 14:
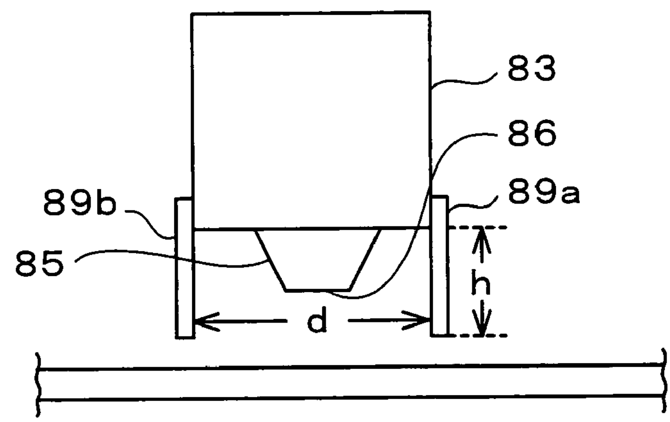

The wafer W formed with the resist film thereon is carried by the main carrier unit 13 to the pre-baking unit 33 and the extension and cooling unit 41 in order, and carried by the wafer carrier 50 to the edge exposure unit 51 and the aligner 4 in order so that the wafer W is subjected to predetermined processing or treatment in each of the units. The wafer W for which exposure processing has been finished in the aligner 4 is carried by the wafer carrier 50 to the extension unit 42, then subjected to predetermined processing in the post-exposure baking unit 44 and the cooling unit 43, and thereafter carried to the developing treatment unit 18 where the wafer W is subjected to developing treatment. At this time, the projections and depressions as shown in FIG. 13 are formed on the surface of the resist film on the wafer W. FIG. 8 is a flowchart showing the outline of the following processing process.

The wafer W for which the developing treatment has been completed is carried to the solvent supply unit 19. The wafer W carried to the solvent supply unit 19 is first held on the holding surface 60*a* of the chuck 60 maintained at a predetermined preset temperature, for example, 23° C. being room temperature. This state is maintained for a predetermined period so that the wafer W is temperature-adjusted at 23° C. (step S1 in FIG. 8). During this period, exhaust of gas from the exhaust cup 70 is being performed so that the solvent supply unit 19 is purged.

When the temperature of the wafer W is adjusted after a lapse of the predetermined period, the solvent supply nozzle 83 is moved from the outside of the exhaust cup 70 to above one end of the wafer W, for example, a position above the wafer W on the positive direction side in the Y-direction. Then, for example, the exhaust of gas from the exhaust cup 70 is temporarily stopped, and the solvent supply nozzle 83 then begins to discharge the solvent gas at a fixed flow rate (step S2 in FIG. 8). In this event, the solvent gas is supplied to a predetermined region on the one end side of the wafer surface. When the solvent supply nozzle 83 begins to discharge the solvent gas, the solvent supply nozzle 83 moves at a fixed speed toward the other end side of the wafer W, that is, the negative direction side in the Y-direction. Along with the movement, the supply region of the solvent gas on the wafer surface also moves to the negative direction side in the Y-direction. Once the solvent supply nozzle 83 has moved to a position above the end of the wafer W on the negative direction side in the Y-direction, the solvent supply nozzle 83 turns back and moves this time from the other end side to the one end side. In this manner, the solvent supply nozzle 83 reciprocates above the wafer W to thereby supply the solvent gas onto the surface of the resist film on the wafer W.

When the solvent gas is supplied onto the surface of the resist film in such a manner, the surface of the resist film R absorbs the solvent gas so that only the surface of the resist film R dissolves and swells. Note that for setting the moving speed and the discharge amount of the solvent supply nozzle 83, values are used which are previously calculated by an experiment or the like so that only the surface of the resist film R dissolves.

After completion of the reciprocation of the solvent supply nozzle 83, the supply of the solvent gas is stopped, and exhaust of gas from the exhaust cup 70 is performed again. The wafer W is transferred from the chuck 60 to the main carrier unit 13 and carried to the heating unit 35.

Figure 9:
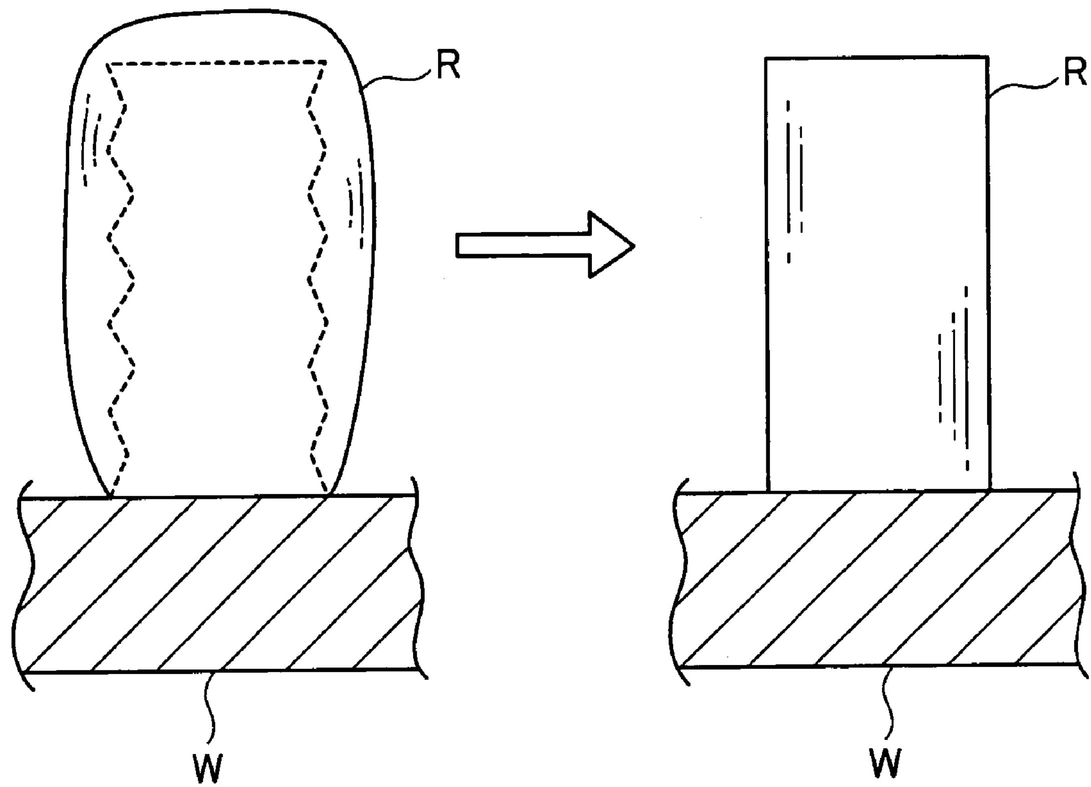

The wafer W carried to the heating unit 35 is transferred to the raising and lowering pins 105 which have been raised and waiting, and mounted on the heating plate 100. The heating plate 100 is maintained at a predetermined temperature, for example, about 110° C., and the wafer W is heated on the heating plate 100 for a predetermined period. The heating for the predetermined period allows the solvent gas in the resist film R to evaporate, whereby the resist film R is heat-shrunk (step S3 in FIG. 8). Thus, the resist film R is returned to the thickness before the solvent gas supply as shown in FIG. 9.

The wafer W for which the heat-drying has been completed is carried out of the heating unit 35 by the main carrier unit 13 and cooled in the cooling unit 43, and then carried to the post-baking unit 47 and the cooling unit 30 in order in each of which the wafer W is subjected to predetermined processing. The wafer W is then returned to the cassette C through the extension unit 32, thus completing a series of photolithography processes for the wafer W.

According to the above-described embodiment, the solvent supply unit 19 having the solvent supply nozzle 83 is provided in the coating and developing treatment system 1, so that the solvent gas can be supplied to the surface of the resist film R after the developing treatment to dissolve and swell the surface of the resist film R so as to smooth it. The heating unit 35 is also provided in the coating and developing treatment system 1, and thus can heat the wafer W after the supply of the solvent gas to the resist film R to volatilize the excess solvent contained in the resist film R. As a result of this, the projections and depressions formed on the surface of the resist film R can be leveled to improve the surface roughness of the resist film R. During the subsequent etching treatment, the base film is evenly etched, whereby a circuit pattern in a predetermined shape is formed on the wafer W.

Since the solvent supply nozzle 83 is configured to be movable with respect to the wafer W in the solvent supply unit 19, the solvent supply nozzle 83 can move above the wafer W while supplying the solvent gas to thereby uniformly supply the solvent gas in an appropriate amount to the entire surface of the resist film R.

The Peltier elements 62 are provided in the chuck 60 in the solvent supply unit 19 to adjust the temperature of the wafer W to 23° C. before the supply of the solvent gas and thus can bring the wafer W to the optimum temperature at which the surface of the resist film R dissolves and uniform the temperature within the wafer W. This allows the surface of the resist film R to preferably dissolve.

While the solvent supply nozzle 83 reciprocates above the wafer W to supply the solvent gas to the resist film R in the above-described embodiment, the solvent gas may be supplied only on the forward path or the backward path of the solvent supply nozzle 83. It is also suitable to supply the solvent gas on the forward path, then rotate the wafer W a predetermined angle, for example, 90 degrees, and thereafter supply the solvent gas on the backward path. In this case, the supply may be performed by providing a rotation mechanism on the chuck 60.

While the temperature adjustment before the supply of the solvent gas is performed in the solvent supply unit 19 in the above-described embodiment, the temperature adjustment may be performed, for example, in the cooling units 30, 40, and 43. In this case, the wafer W after the developing treatment is temporarily carried to the cooling unit where the wafer W is temperature-adjusted to 23° C. and then carried to the solvent supply unit 19.

Figure 10:
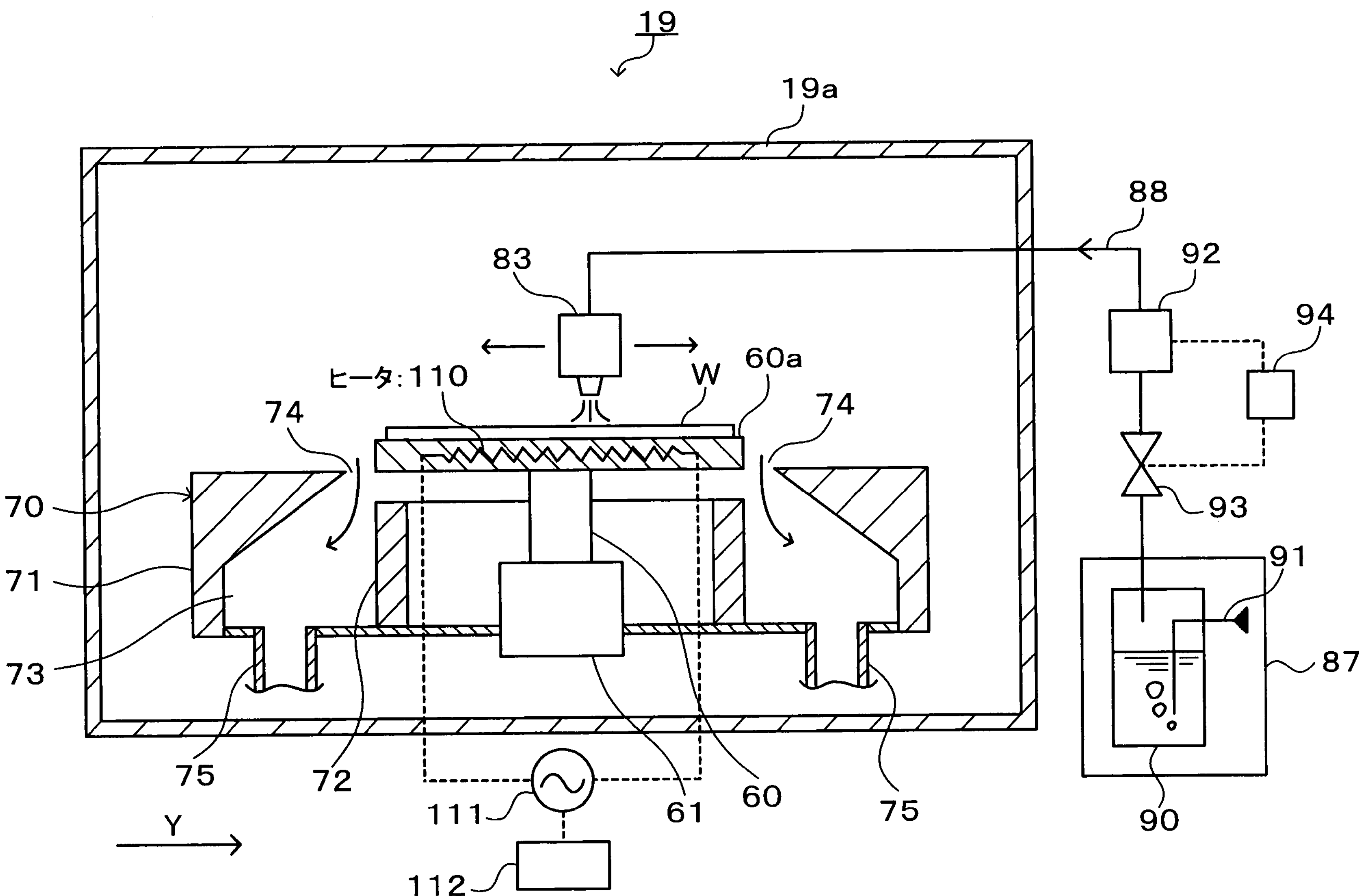

While the heating of the wafer W after the supply of the solvent gas is performed in the heating unit 35 in the above-described embodiment, a heating mechanism may be incorporated in the solvent supply unit 19 so that the heating of the wafer W may be performed in the solvent supply unit 19. In this case, for example, a heat generator 110 such as a heater is built in the chuck 60 in the solvent supply unit 19 as shown in FIG. 10. The heat generator 110 generates heat, for example, by supply of power from a power supply 111, the supply amount from the power supply 111 being controlled by a temperature controller 112. The solvent gas is supplied to the wafer W in the solvent supply unit 19, and the wafer W is then heated in the same solvent supply unit 19. In this case, the supply of the solvent gas and the heating can be performed in the same unit to improve the treatment efficiency of the wafer W. It should be noted that the heating mechanism is composed of, for example, the chuck 60, the heat generator 110, the power supply 111, and the temperature controller 112.

Further, as the above-described heating unit 35, a heating and cooling unit may be used which also includes a cooling function. In this case, the wafer W which has been heated and raised in temperature can be cooled immediately.

Figure 12:
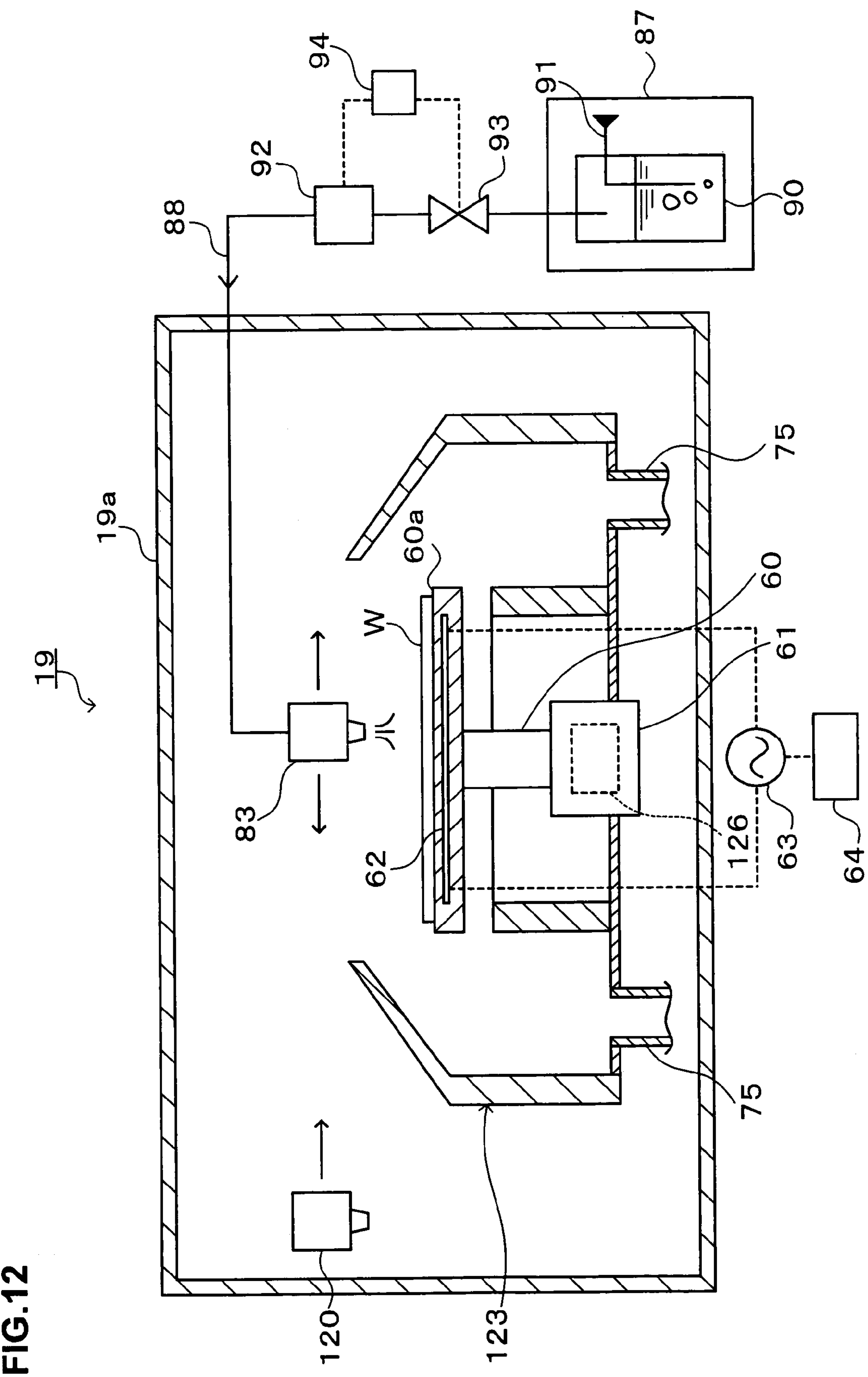

Further, while the developing treatment and the supply treatment of the solvent gas are performed in the separate units in the above-described embodiment, they may be performed in the same unit. For example, a developing treatment mechanism may be incorporated in the solvent supply unit 19. In this case, for example, a developing solution supply nozzle 120 for supplying a developing solution to the wafer W and a cleaning nozzle 121 for supplying a cleaning solution the wafer W are provided, in addition to the solvent supply nozzle 83, in the solvent supply unit 19 as shown in FIG. 11. For example, the developing solution supply nozzle 120 is held, similarly to the solvent supply nozzle 83, on an arm which is freely movable on the rail 80. The cleaning nozzle 121 is held on a holding arm 125 which pivots, for example, about the axis of a vertical shaft 124 provided outside a later-described exhaust cup 123, so that the cleaning nozzle 121 can freely approach to/retreat from a position above the wafer W from/to the outside of the exhaust cup 123. Further, a rotation drive unit 126 is attached to the chuck 60 as shown in FIG. 12 to be able to rotate the wafer W held on the chuck 60 at a predetermined speed. The exhaust cup 123 is formed in a manner to surround the periphery of the chuck 60 so as to receive, for example, the developing solution scattering from the top of the wafer W. Note that the remaining configuration is the same as that of the above-described solvent supply unit 19 and therefore the description thereof is omitted. It should be noted that the developing treatment mechanism in this example is composed of, for example, the developing solution supply nozzle 120, the chuck 60, and the exhaust cup 123.

In the wafer processing, the wafer W for which the post-exposure baking and the cooling have been completed is carried to the solvent supply unit 19 where the wafer W is held on the chuck 60. When the wafer W is held on the chuck 60, the developing solution supply nozzle 120 moves from a position above the one end side to a position above the other end side while supplying the developing solution, whereby the developing solution is supplied on the entire surface of the wafer W. After the developing solution is placed on the wafer W, standstill development is performed during a predetermined period. Thereafter, the wafer W is rotated, and the cleaning nozzle 121 supplies the cleaning solution onto the wafer W to clean the wafer W. Upon completion of the cleaning, the wafer W is rotated at a high speed to be dried. When the wafer W is dried with which a series of steps of the developing treatment has been completed, the solvent supply nozzle 83 supplies the solvent gas to the wafer W as described above to improve the surface roughness of the resist film R. In this case, the developing treatment and the supply treatment of the solvent can be performed in the same unit to omit the carriage time of the wafer W, resulting in improved efficiency of treating the wafer W. Note that while the developing treatment mechanism is incorporated in the solvent supply unit 19 in this case, a solvent supply mechanism such as the solvent supply nozzle 83 may be incorporated in the developing treatment units 18 and 20.

From the experiment actually carried out by the inventor, the result of the above-described smoothing performed for the resist pattern formed by the photolithography process shows that both LER (Line Edge Roughness) and LWR (Line Width Roughness) could be suppressed to lower values than those in the case without smoothing.

As one particular example, the line widths, LWR, before the smoothing treatment and after the smoothing treatment, for example, for a patterned resist film (UV135 4100A Barc: AR-5 600A) formed on a silicon wafer were as those shown in FIG. 13. Note that the solvent gas used at that time was a solvent vapor of acetone. The temperature of the wafer was 23° C., and the solvent concentration was 4.0 L. To supply the solvent vapor of acetone to the wafer, the solvent supply nozzle 83 was scanned over the wafer while supplying the solvent gas, where the scan speed at that time was set to 40 mm/sec.

As can be seen from the result in FIG. 13, the line width (CD) of the pattern slightly decreases after the smoothing treatment has been performed, but the LWR is significantly improved. This shows that the surface of the resist pattern formed on the wafer has been smoothed.

Note that when the solvent supply nozzle 83 supplies the solvent gas to a substrate, it is more preferable that a gap between the nozzle discharge ports 86 of the solvent supply nozzle 83 and the wafer W is narrower. Besides, the appropriate speed of the solvent supply nozzle 83 when scanning is 15 mm/sec to 250 mm/sec.

Where the solvent gas is supplied from the discharge ports 86 of the solvent supply nozzle 83, it is preferable to attach partition plates 89*a* and 89*b* to the front and rear of the discharge portion 85 of the solvent supply nozzle 83. These partition plates 89*a* and 89*b* form a kind of partition walls at the front and the rear of the nozzle in its relative moving direction, and thus can prevent the solvent gas supplied from the discharge ports 86 from diffusing in the back and forth direction and supply the solvent gas uniformly over the entire surface of the wafer W along with the relative movement of the nozzle. It should be noted that a distance d between the partition plates 89*a* and 89*b* is set, for example, to about 20 mm, and a height (the length from the lower end of the main body of the solvent supply nozzle 83) h of the partition plates 89*a* and 89*b* is set to about 10 mm.

Figure 15:
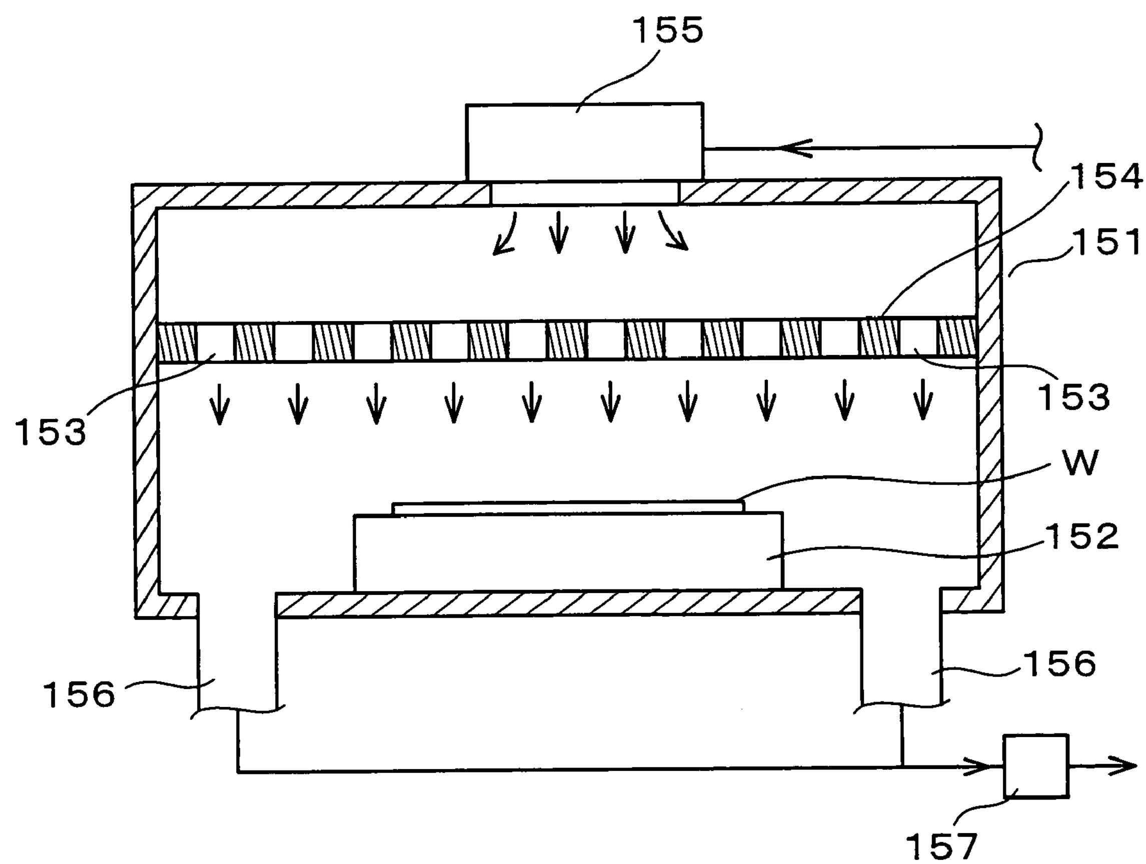

The method of supplying the solvent gas is not limited to a method of relatively moving the solvent supply nozzle 83 as described above to thereby sequentially move the solvent supply region so as to supply the solvent gas over the entire surface of the wafer W as a result. A method may also be employed which supplies the solvent gas from an upper face to the entire surface of the wafer W mounted on a mounting table 152 in a treatment container 151 as shown in FIG. 15.

This treatment container 151 comprises a baffle board 154 formed with many holes 153 at the upper face in the container, so that when the solvent gas is supplied from a solvent gas supply unit 155 located on top of the container, the solvent gas is uniformly supplied through the baffle board 154 onto the entire upper surface of the wafer W. Note that the atmosphere in the treatment container 151 is exhausted by an exhaust pump 157 to the outside of the container through an exhaust port 156 provided at the bottom of the container.

Incidentally, it has been found from the investigation by the inventor that an ArF resist tends to be harder to smooth than a KrF resist even though the solvent gas is supplied. This is conceivably caused by part of a portion called a protecting group existing in the ArF resist inhibiting the solubility thereof. The protecting groups include, for example, a lactone group. Hence, such a protecting group is previously decomposed before the supply of the solvent gas, so that the resist can be smoothly smoothed by the supply of the solvent gas.

Figure 16:
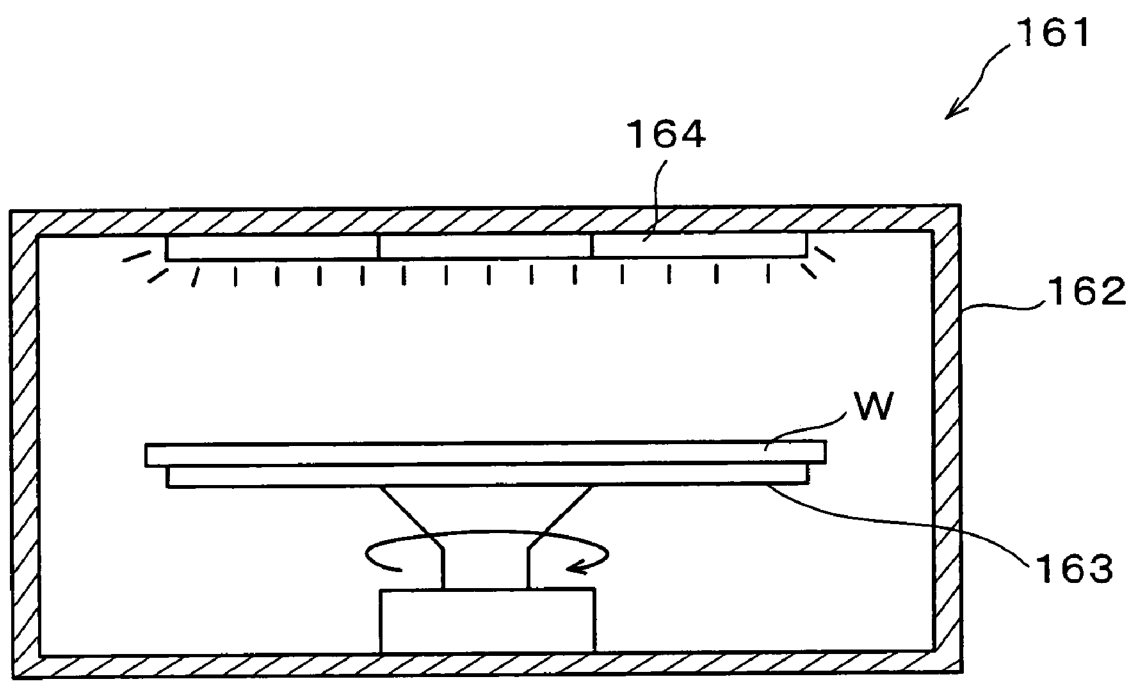
Figure 17:
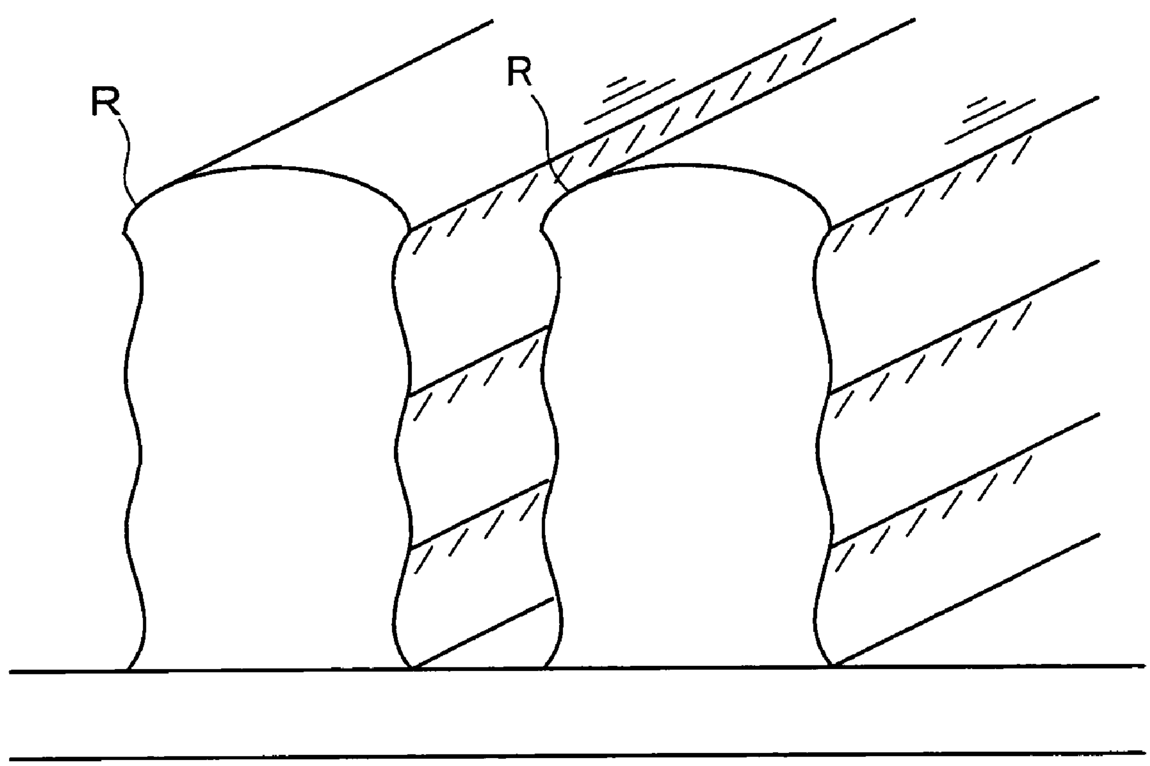

Techniques of decomposing such a dissolution inhibiting protecting group include, for example, irradiation of UV or electron beam. As an apparatus for performing a so-called surface modification treatment, for example, a treatment unit 161 can be proposed, for example, as shown in FIG. 16.

This treatment unit 161 has a rotary mounting table 163 in a treatment container 162 and has an irradiation unit 164 for ultraviolet or electron beam on the upper face in the container. The irradiation unit 164 can irradiate the wafer W with the ultraviolet or electrode beam with the wafer W mounted on the rotary mounting table 162 being rotated to thereby modify the quality of the treatment film on the surface of the wafer W, for example, the resist film so as to decompose the dissolution inhibiting protecting group. Further, the wafer W can be uniformly irradiated with the ultraviolet or electron beam since the irradiation is performed with the wafer W being rotated.

The supply of the above-described solvent gas after decomposition of the dissolution inhibiting protecting group in the treatment film on the wafer W in such a manner allows even the ArF resist used for the resist film to be smoothed preferably. In addition, performance of such a so-called pre-treatment extends the range of solvent choices because smoothing can be performed using even a solvent which had no effect before. The extension of the range of solvent choices allows selection of a solvent suitable for each ArF resist and also offers advantage in the performance of controlling the shape and so on.

The above embodiment illustrates one example of the present invention, and the present invention is not limited to the embodiment but can take various forms. For example, while the plurality of circular discharge ports 86 are formed in the discharge portion 85 of the solvent supply nozzle 83 in this embodiment, a discharge port in a long slit shape at least longer than the diameter of the wafer W may be formed. Further, while the solvent supply nozzle 83 is moved with respect to the wafer W in the solvent supply unit 19, the wafer W side may be moved. Furthermore, while this embodiment relates to treatment of the wafer W, the present invention is also applicable to other substrates such as an LCD substrate, a glass substrate for photomask, and so on.

INDUSTRIAL APPLICABILITY

The present invention can improve surface roughness of a treatment film such as a resist film formed on various kinds of substrates such as a semiconductor wafer, a flat display substrate, and so on. Accordingly, the present invention is useful in manufacturing process of a semiconductor device, a substrate for various kinds of displays, and a substrate for photomask.

What is claimed:

1. A method, implemented on a substrate treatment apparatus, of improving surface roughness of a treatment film formed on a substrate, the method comprising:

after exposing and developing the substrate, supplying a solvent gas of the treatment film to the surface of the treatment film to dissolve only the surface of the treatment film on the substrate, wherein when supplying the solvent gas of the treatment film to the surface of the treatment film, the solvent gas of the treatment film is supplied to a region of a part of the surface of the substrate and the region to be supplied with the solvent gas is moved, so that the solvent gas is supplied to the entire surface of the treatment film.

2. The method as set forth in claim 1, further comprising the step of:

after said step of supplying the solvent gas, heating the substrate.

3. The method as set forth in claim 1, further comprising the step of:

before said step of supplying the solvent gas to the surface of the treatment film, temperature-adjusting the substrate to a predetermined temperature.

4. The method as set forth in claim 1, further comprising:

after exposing and developing the substrate and before supplying the solvent gas of the treatment film to the surface of the treatment film, a treatment step of decomposing a protecting group inhibiting dissolution in the treatment film.

5. The method as set forth in claim 4, wherein said treatment step is performed by irradiation of ultraviolet or electron beam.

6. The method as set forth in claim 1, wherein the treatment film is a resist film, and the solvent gas is a vapor of acetone.

7. The method as set forth in claim 1, wherein the treatment film is a resist film, and the solvent gas is a vapor of propylene glycol monomethyl ether acetate.

8. The method as set forth in claim 1, wherein the treatment film is a resist film, and the solvent gas is a vapor of N-methyl-2-pyrrolidinone.

9. A method, implemented on a substrate treatment apparatus, of improving surface roughness of a treatment film formed on a substrate, comprising:

after exposing and developing the substrate, supplying a solvent gas of the treatment film to a surface of the treatment film to dissolve only the surface of the treatment film on the substrate; and after exposing and developing the substrate and before supplying the solvent gas of the treatment film to the surface of the treatment film, decomposing a protecting group inhibiting dissolution in the treatment film, said decomposing being performed by irradiation of ultraviolet or electron beam.

* * * * *